United States Patent
Wark

(10) Patent No.: US 7,005,870 B2
(45) Date of Patent: Feb. 28, 2006

(54) INTERCONNECT BUMP PLATE

(75) Inventor: James M. Wark, Boise, ID (US)

(73) Assignee: Micron Technology, Inc., Boise, ID (US)

(*) Notice: Subject to any disclaimer, the term of this patent is extended or adjusted under 35 U.S.C. 154(b) by 8 days.

(21) Appl. No.: 10/173,957

(22) Filed: Jun. 17, 2002

(65) Prior Publication Data
US 2002/0158655 A1 Oct. 31, 2002

Related U.S. Application Data

(63) Continuation of application No. 09/521,932, filed on Mar. 9, 2000, now Pat. No. 6,411,118, which is a continuation of application No. 08/994,004, filed on Dec. 18, 1997, now Pat. No. 6,140,827.

(51) Int. Cl.
G01R 31/02 (2006.01)
G01R 31/28 (2006.01)

(52) U.S. Cl. .................. 324/755; 324/758; 324/765

(58) Field of Classification Search ............ 324/765, 324/158.1, 756, 757, 758, 763, 755, 754; 361/633
See application file for complete search history.

(56) References Cited

U.S. PATENT DOCUMENTS

| | | | |
|---|---|---|---|
| 229,757 A | 7/1880 | Ross | |
| 231,421 A * | 8/1880 | Gilliland | 361/633 |
| 2,958,064 A | 10/1960 | Swengel | |
| 3,806,800 A | 4/1974 | Bove et al. | |
| 4,585,991 A | 4/1986 | Reid et al. | |
| 4,792,683 A | 12/1988 | Chang et al. | |
| 4,838,800 A | 6/1989 | Lynch | |
| 5,058,178 A | 10/1991 | Ray | |
| 5,089,772 A | 2/1992 | Hatada et al. | |
| 5,108,024 A | 4/1992 | Kazen-Goudarzi et al. | |
| 5,177,439 A | 1/1993 | Liu et al. | |
| 5,225,037 A | 7/1993 | Elder et al. | |
| 5,367,253 A | 11/1994 | Wood et al. | |
| 5,394,490 A | 2/1995 | Kato et al. | |

(Continued)

OTHER PUBLICATIONS

WYKO, 2650 East Elvira Road, Tucson, Arizona USA 85706—Advertisement—single page, "Now see all the bumps on the road to success in flip-chip packaging".

Primary Examiner—Ernest Karlsen
(74) Attorney, Agent, or Firm—TraskBritt

(57) ABSTRACT

A method and apparatus for testing unpackaged semiconductor dice having raised ball contact locations are disclosed. The apparatus uses a temporary interconnect wafer that is adapted to establish an electrical connection with the raised ball contact locations on the die without damage to the ball contact locations. The interconnect is fabricated on a substrate, such as silicon, where contact members are formed in a pattern that matches the size and spacing of the ball contact locations on the die to be tested. The contact members on the interconnect wafer are formed as either pits, troughs, or spike contacts. The spike contacts penetrate through the oxide layer formed on the raised ball contact locations. Conductive traces are provided in both rows and columns and are terminated on the inner edges of the walls of the pits formed in the substrate. This arrangement allows a system to measure the continuity across the bump pad or ball contact locations of the integrated circuit die in order to establish that each solder ball location is properly attached. This allows the system to test for the presence and quality of the bumps or balls on the particular die being tested.

5 Claims, 3 Drawing Sheets

U.S. PATENT DOCUMENTS

| | | |
|---|---|---|
| 5,479,105 A | 12/1995 | Kim et al. |
| 5,479,694 A | 1/1996 | Baldwin |
| 5,495,179 A | 2/1996 | Wood et al. |
| 5,510,721 A | 4/1996 | Walles et al. |
| 5,523,696 A | 6/1996 | Charlton et al. |
| 5,530,375 A | 6/1996 | Seidel |
| 5,543,724 A | 8/1996 | Christopher |
| 5,550,763 A | 8/1996 | Michael et al. |
| 5,585,281 A | 12/1996 | Truhitte et al. |
| 5,592,736 A | 1/1997 | Akram et al. |
| 5,617,209 A | 4/1997 | Svettkoff et al. |
| 5,646,442 A | 7/1997 | Abe et al. |
| 5,703,406 A | 12/1997 | Kang |
| 5,783,865 A | 7/1998 | Higashiguchi et al. |
| 5,787,098 A | 7/1998 | DasGupta et al. |
| 5,796,591 A | 8/1998 | Dalal et al. |
| 5,834,844 A | 11/1998 | Akagawa et al. |
| 5,877,559 A | 3/1999 | Takayama et al. |
| 5,883,435 A | 3/1999 | Geffken et al. |
| 5,920,125 A | 7/1999 | Ellerson et al. |
| 5,946,553 A | 8/1999 | Wood et al. |
| 5,965,945 A | 10/1999 | Miller et al. |
| 5,994,781 A | 11/1999 | Smith |
| 6,018,249 A | 1/2000 | Akram et al. |
| 6,037,667 A | 3/2000 | Hembree et al. |
| 6,040,702 A | 3/2000 | Hembree et al. |
| 6,046,909 A | 4/2000 | Joy |
| 6,075,290 A | 6/2000 | Schaefer et al. |
| 6,091,252 A | 7/2000 | Akram et al. |
| 6,127,736 A | 10/2000 | Akram |
| 6,143,989 A | 11/2000 | Greenbaum |
| 6,310,484 B1 | 10/2001 | Akram et al. |
| 6,362,637 B1 | 3/2002 | Farnworth et al. |
| 6,380,492 B1 | 4/2002 | Yoshioka |

* cited by examiner

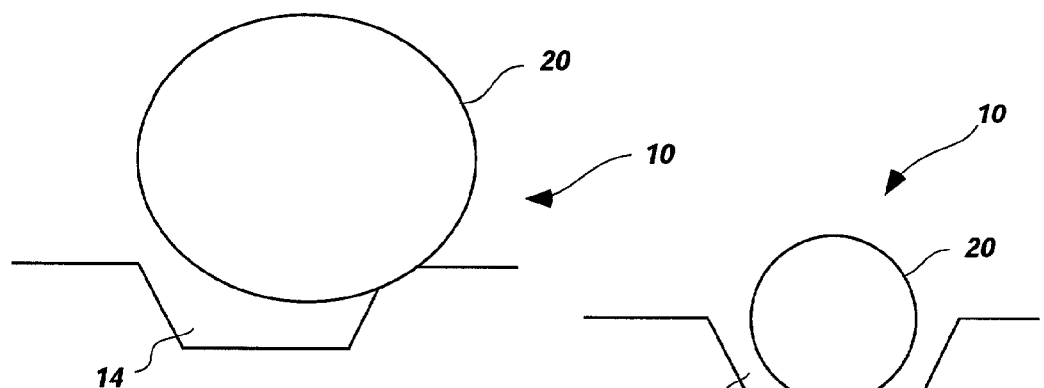
Fig. 6
Fig. 7
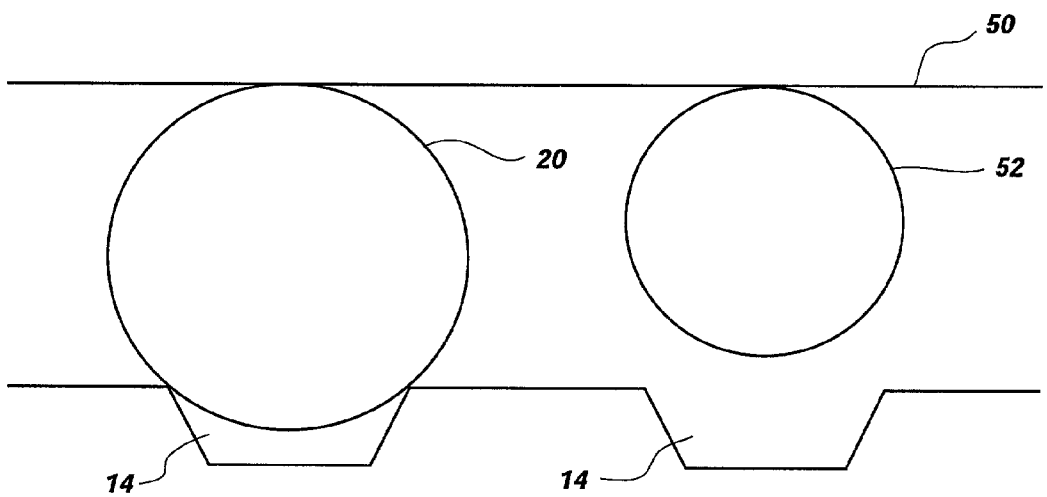
Fig. 8
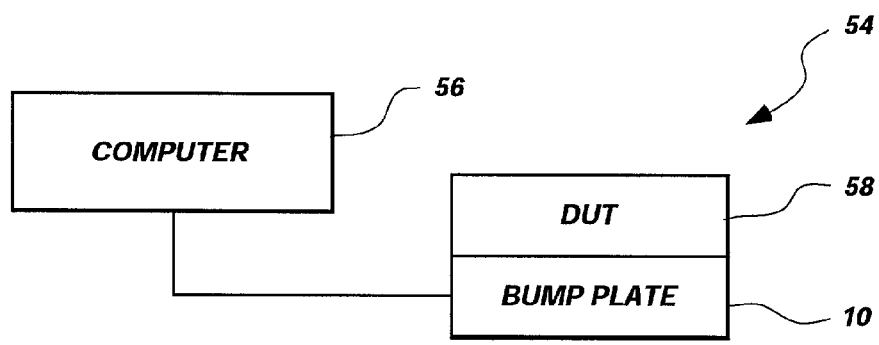
Fig. 9

INTERCONNECT BUMP PLATE

CROSS-REFERENCE TO RELATED APPLICATIONS

This application is a continuation of U.S. application Ser. No. 09/521,932, filed Mar. 9, 2000, now U.S. Pat. No. 6,411,118, issued Jun. 25, 2002, which is a continuation of U.S. application Ser. No. 08/994,004, filed Dec. 18, 1997, now U.S. Pat. No. 6,140,827, issued Oct. 31, 2000.

BACKGROUND OF THE INVENTION

The present invention relates generally to semiconductor manufacturing and, more particularly, to methods for testing semiconductor dice having raised or bumped bond pads. More particularly still, the present invention relates to fabricating and using a testing grid suitable for testing solder balls used for bumped bond pads on an unpackaged semiconductor die.

Semiconductor dice are being fabricated with raised bond pads and are known as bumped semiconductor die. A bumped semiconductor die includes bond pads along with bumped solderable material such as a lead-tin alloy. These typically are manufactured from solder balls made of a lead-tin alloy. Bumped dies are often used for flip-chip bonding where the die is mounted face down on the substrate, such as a printed circuit board, and then the die is attached to the substrate by welding or soldering. Typically, the bumps are formed as balls of materials that are circular in a cross-sectional plane parallel to the face of the die. The bumps typically have a diameter of from 50 micrometers ($\mu$m) to 100 $\mu$m. The sides of the bumps typically bow or curve outwardly from a flat top surface. The flat top surface forms the actual region of contact with a mating electrode on the printed circuit board or other substrate. In testing the attached solder bumps, a temporary electrical connection must be made between the ball contact locations or bond pads on the die and the external test circuitry associated with the testing apparatus. The bond pads provide a connection point for testing an integrated circuit on the die. Likewise, the integrity of each bump must be tested as well.

In making this temporary electrical connection, it is desirable to effect a connection that causes as little damage as possible to the bumped die. If the temporary connection to the bumped bond pad damages the pad, the entire die may be ruined. This is difficult to accomplish because the connection must also produce a low resistance or ohmic contact with the bumped bond pad. A bond pad, with or without a bump, typically has a metal oxide layer formed over it that must be penetrated to make the ohmic contact.

Some prior art contact structures, such as probe cards, scrape the bond pads and wipe away the oxide layer. This causes excess layer damage to the bond pads. Other interconnect structures, such as probe tips, may pierce the oxide layer and metal bond pad and leave a deep gouge. Still other interconnect structures, such as micro bumps, cannot even pierce the oxide layer, preventing the formation of an ohmic contact.

In the past, following testing of a bump pad die, it has been necessary to reflow the bumps, which are typically damaged by the procedure. This is an additional process step that adds to the expense and complexity of the testing process. Furthermore, it requires heating the tested die that can adversely affect the integrated circuitry formed on the die.

Other bond pad integrity testing systems have been developed in the prior art. Typically, these testing systems use optical imaging to determine the integrity of the weld connection on the bumped sites. One type of system is a profiling system that uses interferometry with robotic wafer handling to automate the testing step. The testing step develops a profile for measuring solder bump heights. Unfortunately, although the interferometry system does not damage the device in any way, the time required for analyzing each bump location can take from two to four minutes. This type of throughput is unacceptable when a high speed system is necessary.

Accordingly, what is needed is a method and system for testing solder bumps in bond pad locations that does not damage the bond pads while improving throughput.

SUMMARY OF THE INVENTION

According to the present invention, a method and apparatus for testing unpackaged semiconductor dice having raised ball contact locations are disclosed. The apparatus uses a temporary interconnect wafer that is adapted to establish an electrical connection with the raised ball contact locations on the die without damage to the ball contacts. The interconnect wafer is fabricated on a substrate, such as silicon, where contact members are formed in a pattern that matches the size and spacing of the ball contact locations on the die to be tested. The contact members on the interconnect wafer are formed as either pits, troughs, or spike contacts. The spike contacts penetrate through the oxide layer formed on the raised ball contact location. Conductive traces are provided in both rows and columns and are terminated on the inner edges of the walls of the pits formed in the substrate. This arrangement allows a system to measure the continuity across the bump pad or ball contact locations of the integrated circuit die in order to establish that each ball contact location is properly attached. This also allows the system to test for the presence and quality of the bump or ball contact locations on the particular die being tested.

BRIEF DESCRIPTION OF THE SEVERAL VIEWS OF THE DRAWING

FIG. 6 is an example of a solder ball being out of place and failing to make adequate connection between adjacent metal bonds;

FIG. 7 is an example of when a ball that is too small has been identified;

FIG. 8 is a schematic cross-sectional view of a device under test where mismatched balls are adjacent to one another; and, FIG. 9 is a block diagram of a test apparatus using the bump plate according to FIG. 3.

DETAILED DESCRIPTION OF THE INVENTION

Figure 1:
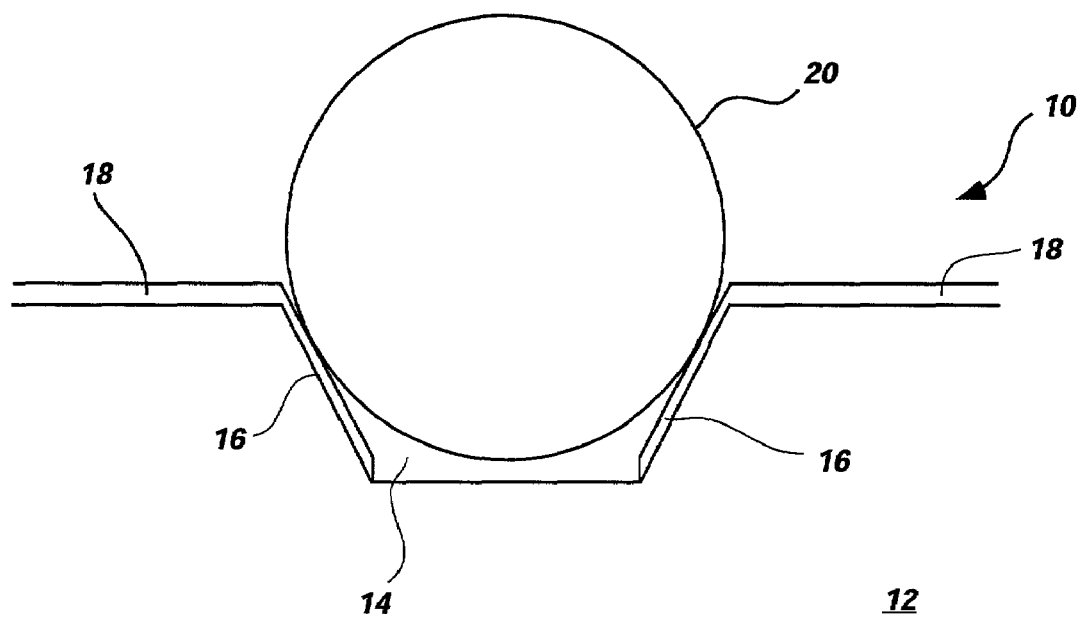
FIG. 1 is a schematic cross-sectional diagram of a pit formed in a substrate wherein a solder ball is received.

FIG. 1 is a cross-sectional schematic view of a bump plate 10 for testing the connect conductivity and quality of a solder ball on an unpackaged semiconductor die. Bump plate 10 is fabricated in a semiconductor substrate 12, such as, for example, silicon, gallium arsenide, or silicon on sapphire, to name a few.

A plurality of receiving pits 14 is formed in the surface of substrate 12. Receiving pit 14 can be any desired polygonal or curved shape, but is preferred to be square with four sloped side walls 16. Each side wall 16 is at an angle of 54° from horizontal, conforming to the plane of the surface of the silicon substrate that can be used in fabricating bump plate 10. After pits or suitable features are etched (formed), the surface of the plate is coated with a thin layer insulator of about 200–300 Angstroms (such as Si Oxide) before the metal traces are formed. Electrical connection for testing for the presence of the solder balls on the die is provided by metal traces 18. Metal traces 18 are made from a suitable metal and extend across the surface of substrate 12 and down side walls 16 of receiving pit 14. A solder ball or bump 20 can then be positioned within receiving pit 14 and contact all four sloped side walls 16. Ball 20 is placed within receiving pit 14 when a die under test is mated with bump plate 10. Since a metal trace 18 is placed on each side wall 16 and extends across the surface of substrate 12 to an adjacent receiving pit 14, an applied electric current can flow through metal traces 18 provided the solder ball 20 contacts both sides of side wall 16 and metal trace 18 thereon.

A method that is adaptable for manufacturing bump plate 10 is described in U.S. Pat. No. 5,592,736, "Fabricating An Interconnect For Testing Unpackaged Semiconductor Dice Having Raised Bond Pads," commonly assigned to the same assignee as the present invention, and herein incorporated by reference for all purposes.

Figure 2:
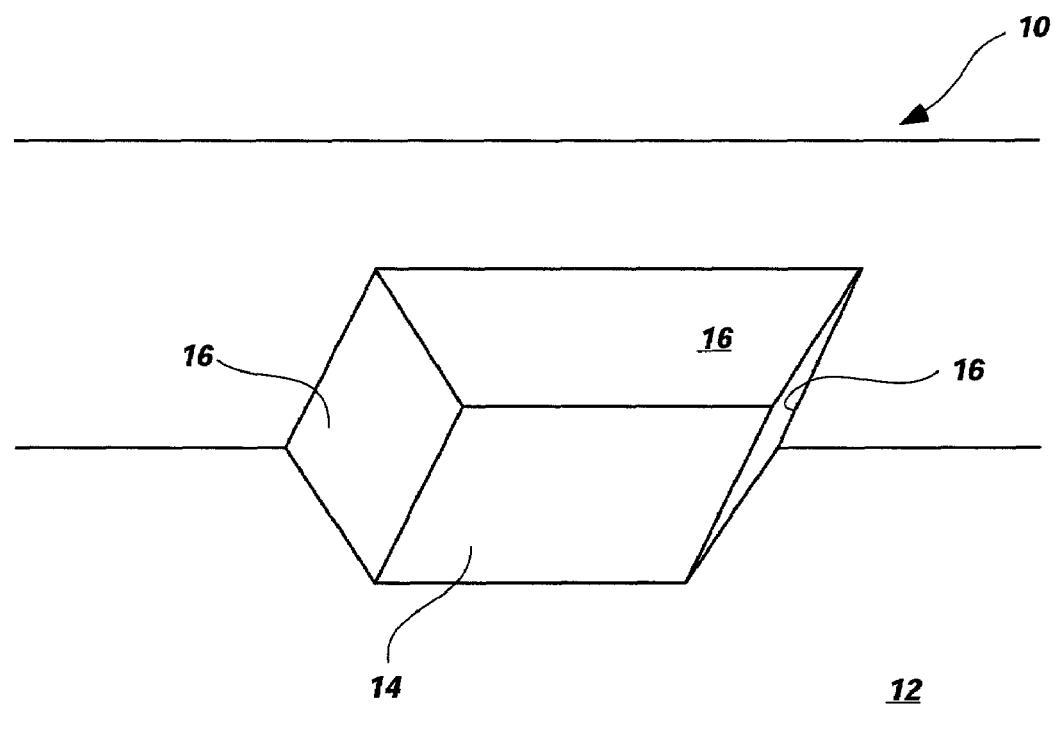
FIG. 2 is a cross-sectional perspective schematic view of the pit according to FIG. 1.

FIG. 2 depicts, in a cross-sectional perspective view, receiving pit 14 prior to the addition of metal trace 18 of FIG. 1. Receiving pit 14 has a substantially flat bottom surface that is non-conductive as well as four adjacent side walls 16, again having the slope angle that naturally slopes 54° in the surface plane of silicon substrate 12 as it is etched. The sloped side wall 16 allows for a spherical ball 20 to seat within receiving pit 14 without damaging the bottom curvature of ball 20 while still contacting metal trace 18 that extends down the slope of side wall 16.

Figure 3:
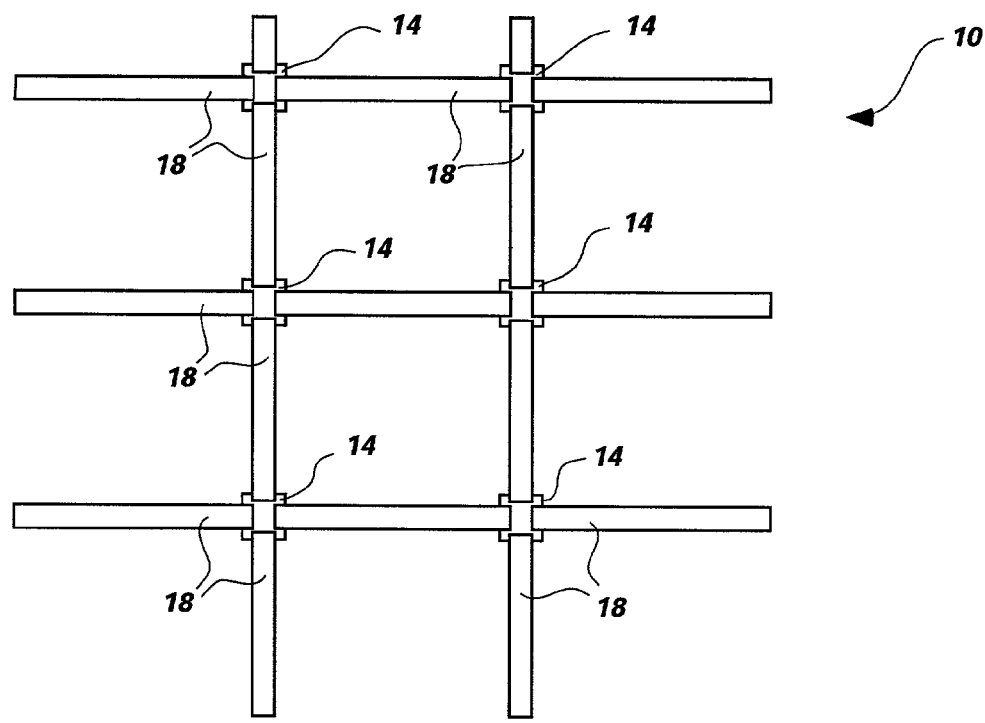
FIG. 3 is a top plan view of an array of pits according to that of FIG. 1 having a metal interconnect in a form of rows and columns.

Bump plate 10 has a plurality of receiving pits 14 and is shown in the schematic diagram of FIG. 3. Bump plate 10 actually is an array of bump pits 14 that is electrically connected in rows and columns using metal traces 18. Horizontal metal traces 18 run across the surface of substrate 12 and down the sloped side walls 16 of the bump pits 14. It is important that metal traces 18 do not connect with one another within receiving pits 14. As an electric current is placed across each row and down each column in a sequential manner, it becomes readily apparent at each receiving pit 14 location whether a ball exists or the connection is of such poor quality as to provide no conduction across the row or down the column. From this information, a grid map of the defects can be established that will allow repair of the missing or poor quality bumped locations at a subsequent repair stage.

Figure 4:
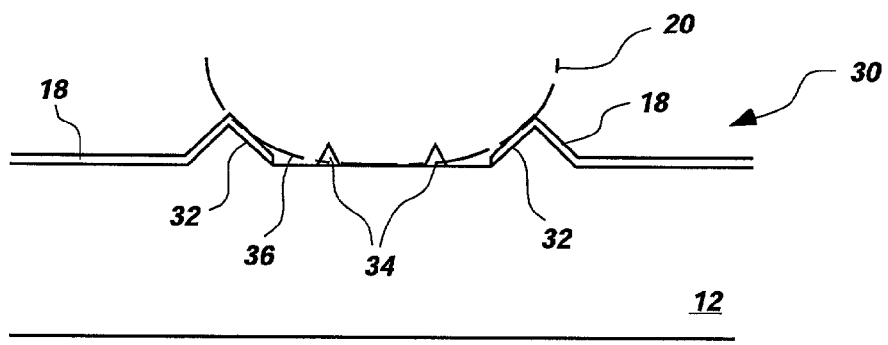
FIG. 4 is an alternative embodiment of the pit of FIG. 1 wherein raised supports are provided along with sharp blades for penetrating the ball.
Figure 5:
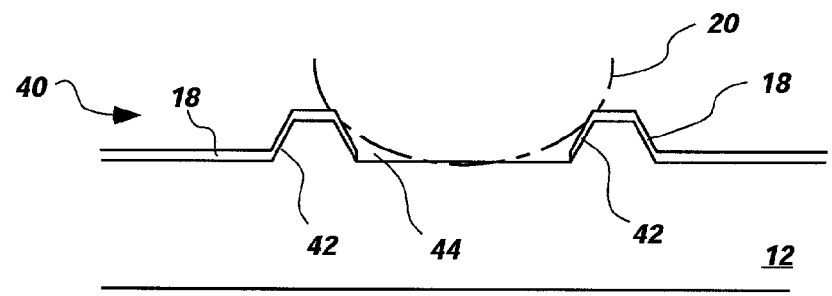
FIG. 5 is an alternative embodiment of the pit of FIG. 1 wherein raised portions are provided for penetrating the solder balls.

Alternative embodiments to receiving pits 14 within the substrate 12 are shown in FIGS. 4 and 5. FIG. 4 illustrates a raised ball contact location 30 for contacting the bottom surface of a solder ball 20. Each raised ball contact location 30 comprises a set of side bumps 32 that form a valley 36. A plurality of sharpened projections 34 is formed within valley 36 and is designed to pierce the oxide layer formed over ball 20 and can be attached to adjacent metal traces 18 for providing good ohmic contact to adjacent metal traces 18 with ball 20 for testing purposes. Ball contact location 30 can be in the shape of a polygon or circle and can be combined with receiving pits 14 of FIG. 3.

FIG. 5 is an alternative embodiment where each receiving pit 14 is replaced with a post trough 40, which is formed by a plurality of posts 42 to form a polygon, such as a square. Posts 42 are formed such that a valley 44 is formed in post trough 40. Metal traces are formed up and down the sides of post 42, but not connecting one another in the same manner as traces 18 in FIG. 3. Thus, when a ball 20 is placed in a post trough 40, a good ohmic connection forms between opposite traces 18 for conducting a test current. Further, post trough 40 can be in the shape of a polygon or circle and can be combined with receiving pits 14 of FIG. 3 or ball contact locations 30 of FIG. 4.

Each of the embodiments of FIGS. 1–5 is capable of testing for various types of solder ball conditions. The most significant is when a missing ball occurs. This is simple to detect in that no current will flow either across the column or down the row when the test current is applied. Other examples are also possible and are illustrated in FIGS. 6, 7, and 8. FIG. 6 is an example of when a solder ball 20 is off center and only contacts one or two sides of receiving pit 14, thus preventing a good current signal from passing either across the column or down the row. FIG. 7 is an example of a ball 20 too small to touch any sides in receiving pit 14. In this condition, no current can pass and it is viewed as being that no solder ball is present. FIG. 8 depicts where adjacent balls of different sizes are attached to die 50. A first ball 20 has a first diameter and a second ball 52 has a second diameter, which is much smaller than the first diameter of ball 20. As is shown, ball 20 is an appropriate size and contacts well with the sides of receiving pit 14. By contrast, ball 52 is too small to even reach receiving pit 14, so the current signal test shows it as not being present at all. Of course, the reverse can be true in that ball 52 is actually the desired size of the balls while ball 20 is an aberration and is much larger than desired. This would also be evident in that many balls would be seen as not being present as the diameter of ball 20 would prevent several adjacent balls from contacting in their respective pits.

FIG. 9 depicts a test apparatus 54 that uses a bump plate 10, or a bump wafer 10. Apparatus 54 comprises a signal processor, such as a computer system 56, that attaches to a bump plate 10. Electrical signals or current are passed to bump plate 10 along the rows and columns of the metal traces 18 to establish a test pattern. A device under test (DUT) 58 is pressed upon bump plate 10 to match the solder ball pattern to the identical pattern fabricated on bump plate 10. Once contact is made, the test is begun and the results are obtained more quickly compared to prior art test apparatus using optical or other mechanical means previously described.

The bump die wafer inspection apparatus of the present invention offers the following advantages over the prior art. As the electronic world moves toward stencification miniaturization, better methods for testing these technologies are needed and this solution provides an advancement over those previously available and, using semiconductor fabrication techniques, a bump plate matching a desired solder ball pattern for a particular die can be generated. The silicon or other similar substrates serve as a rigid medium, and as a result of this rigidity, they have a fixed dimensional test capability for each bump/ball testing site. This limits its use with regard to the range of the dimensional tolerances that it can test. This is significant in that the bumps, or balls, or both, require tight dimensional tolerances to pass such testing. The silicon micro-machining and photolithography processes allow much more precise geometry control than the printed circuit board (PCB) or film technologies found in the prior art. Hence, a more definitive distinction and grading is made for each ball shape and position. Additionally, the present apparatus provides a unique methodology for electronically mapping the failing ball sites and then utilizing this map to direct a repair or rework system to correct each failing site. These operations of testing, mapping, and subsequent repair can be combined in a highly automated in-line process, thus reducing the necessary steps previously required in the prior art of removing the bad boards and sending them to the rework section of the fabrication operation.

Another advantage is since the semiconductor substrate can be planarized to a uniform flatness compared to the PCB and other processing solutions, less damage is caused to the good solder balls attached to the DUT.

Thus the invention provides an improved method and system for testing a discrete, unpackaged semiconductor die having raised bond pads. Although specific materials have been described, it is understood that other materials can be utilized. Furthermore, although the method of the invention has been described with reference to certain specific embodiments as will be apparent to those skilled in the art, modifications can be made without departing from the scope of the invention as defined in the following claims.

What is claimed is:

1. An interconnect bump plate fabricated to test continuity of a plurality of contact bumps on an unpackaged semiconductor die, said interconnect bump plate having an upper surface, said interconnect bump plate comprising:

a plurality of contact receiving sites, said plurality of contact receiving sites fabricated extending down into portions of said interconnect bump plate below said upper surface thereof corresponding to a size and spacing pattern established by said plurality of contact bumps on said unpackaged semiconductor die, said plurality of contact receiving sites comprising a plurality of pits fabricated in a semiconductor substrate having opposing walls for having a plurality of metal traces extends down said opposing walls but do not contact one another; and a plurality of metal traces for each site of said plurality of contact receiving sites to contact a corresponding contact bump of said plurality of contact bumps received at each contact receiving site of said plurality of contact receiving sites.

2. The interconnect bump plate according to claim 1, wherein said plurality of metal traces forms a connected array of rows and columns interconnecting each contact receiving site to at least one adjacent contact receiving site of said plurality of contact receiving sites.

3. An interconnect bump plate fabricated to test continuity of a plurality of contact bumps on an unpackaged semiconductor die, said interconnect bump plate having an upper surface, said interconnect bump plate comprising:

a plurality of contact receiving sites, said plurality of contact receiving sites fabricated extending down into portions of said interconnect bump plate below said upper surface thereof corresponding to a size and spacing pattern established by said plurality of contact bumps on said unpackaged semiconductor die, said plurality of contact receiving sites including:

a plurality of risers, over which a plurality of metal traces can extend; and a plurality of blades, situated between said plurality of risers, to pierce an oxide layer on a corresponding contact bump of said plurality of contact bumps; and a plurality of metal traces for each site of said plurality of contact receiving sites to contact said corresponding contact bump of said plurality of contact bumps received at each contact receiving site of said plurality of contact receiving sites.

4. An interconnect bump plate fabricated to test continuity of a plurality of contact bumps on an unpackaged semiconductor die, said interconnect bump plate having an upper surface, said interconnect bump plate comprising:

a plurality of contact receiving sites, said plurality of contact receiving sites fabricated extending down into portions of said interconnect bump plate below said upper surface thereof corresponding to a size and spacing pattern established by said plurality of contact bumps on said unpackaged semiconductor die, each contact receiving site comprising:

a plurality of retaining posts having one metal trace of a plurality of metal traces extending over each retaining post of said plurality of retaining posts and in which a bump seat is formed for receiving a corresponding contact bump of said plurality of contact bumps.

5. The interconnect bump plate according to claim 1, wherein each of said plurality of metal traces comprises a unitary metal trace.

* * * * *

UNITED STATES PATENT AND TRADEMARK OFFICE
CERTIFICATE OF CORRECTION

PATENT NO. : 7,005,870 B2  
APPLICATION NO. : 10/173957  
DATED : February 28, 2006  
INVENTOR(S) : James M. Wark It is certified that error appears in the above-identified patent and that said Letters Patent is hereby corrected as shown below:

COLUMN 3, LINE 50, change "bump pits 14" to --receiving pits 14--  
COLUMN 3, LINE 53, change "bump pits 14." to --receiving pits 14.--

Signed and Sealed this

Fourth Day of December, 2007

JON W. DUDAS  
*Director of the United States Patent and Trademark Office*